United States Patent
Hsieh et al.

(10) Patent No.: US 8,283,093 B2
(45) Date of Patent: Oct. 9, 2012

(54) OPTICAL PROXIMITY CORRECTION PROCESS

(75) Inventors: Te-Hsien Hsieh, Kaohsiung County (TW); Jing-Yi Lee, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 239 days.

(21) Appl. No.: 12/796,918

(22) Filed: Jun. 9, 2010

(65) Prior Publication Data
US 2011/0305977 A1    Dec. 15, 2011

(51) Int. Cl.
G03F 1/36    (2012.01)

(52) U.S. Cl. .......................................................... 430/5

(58) Field of Classification Search ............... 430/5, 30, 430/311, 322, 394; 716/50–56
See application file for complete search history.

(56) References Cited

U.S. PATENT DOCUMENTS

| | | | |
|---|---|---|---|
| 6,853,743 B2 * | 2/2005 | Kotani et al. | 382/144 |
| 6,978,438 B1 * | 12/2005 | Capodieci | 716/53 |
| 7,459,243 B2 * | 12/2008 | Sasaki | 430/5 |
| 2008/0120589 A1 * | 5/2008 | Tsutsui et al. | 716/19 |

* cited by examiner

*Primary Examiner* — Stephen Rosasco
(74) *Attorney, Agent, or Firm* — Ding Yu Tan

(57) ABSTRACT

An optical proximity correction process for designing a mask according to a target exposure intensity of each edge of a pattern is provided. Each edge is at a corresponding current edge position which corresponds to a current exposure intensity. The process comprises repeating a convergence process on each edge to determine an adjusted position for the edge until an adjusted exposure intensity of the edge is equal to the target exposure intensity. For each edge, the convergence process comprises comparing the target exposure intensity with the current exposure intensity to determine an in-position correlating to a first exposure intensity and an out-position correlating to a second exposure intensity, wherein the target exposure intensity is within a range between the first and the second exposure intensities. An interpolation is performed to obtain the adjusted position according to the target exposure intensity. The pattern is updated according to the adjusted position.

16 Claims, 7 Drawing Sheets

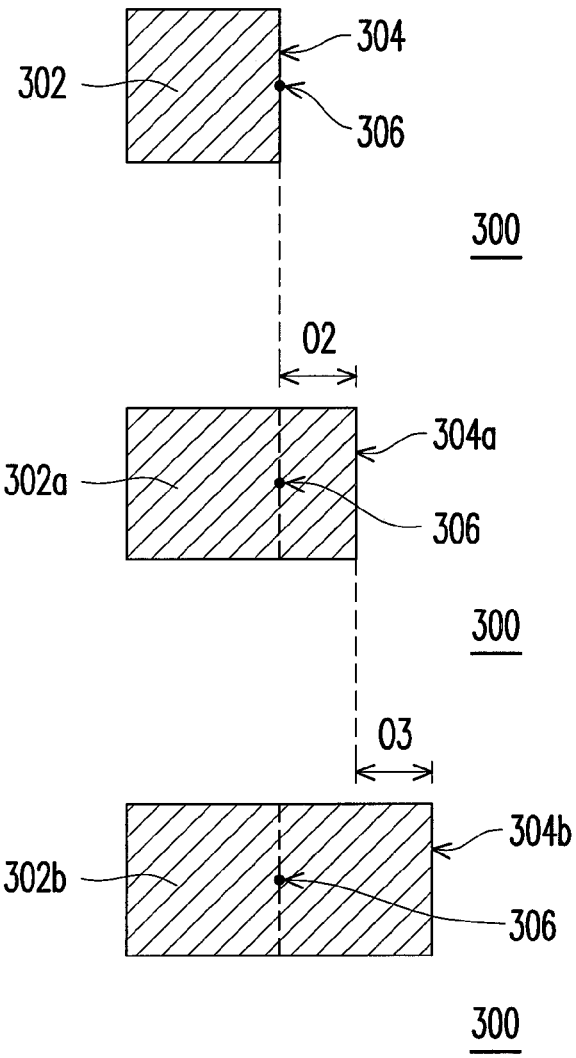
FIG. 3A
FIG. 3B
FIG. 3C
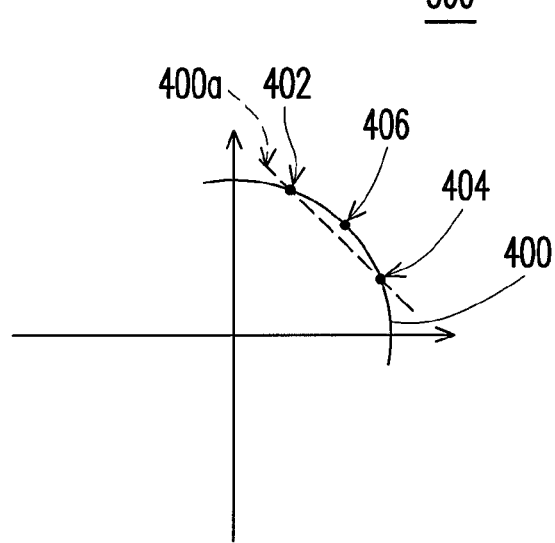
FIG. 4

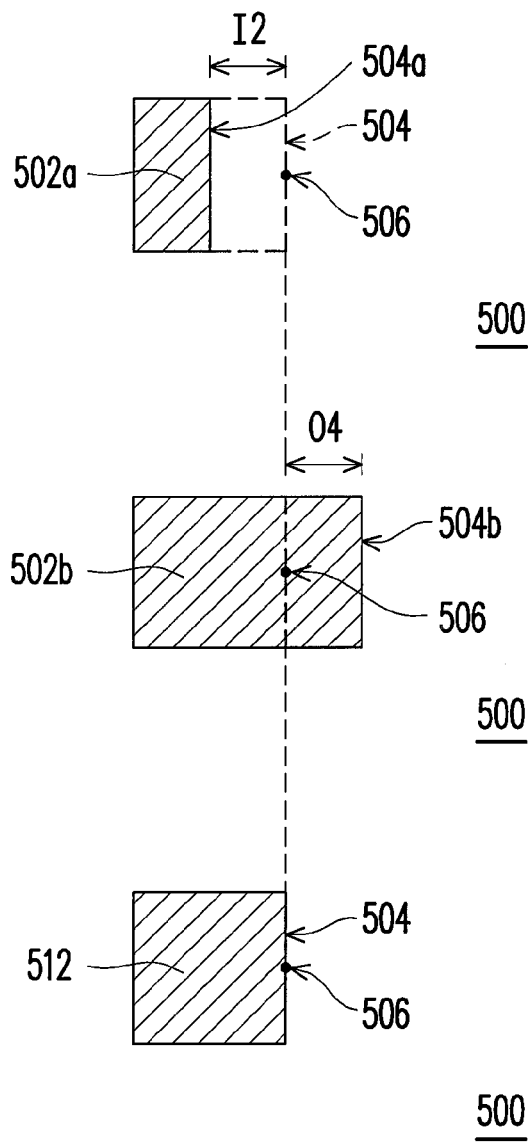
FIG. 5A
FIG. 5B
FIG. 5C
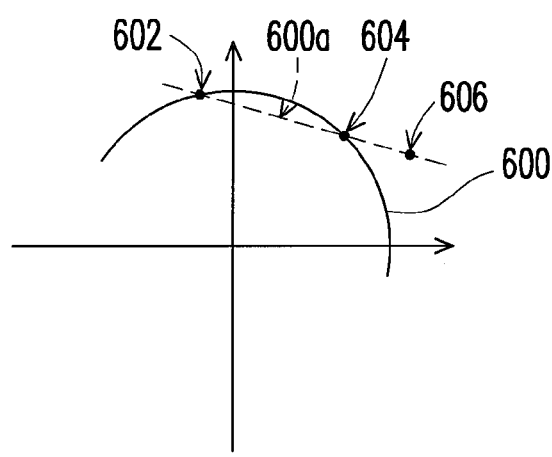
FIG. 6

| iter_no | conventional OPC | | inventive OPC | |
|---|---|---|---|---|
| | calculating times | CORWT_Value | calculating times | CORWT_Value |
| 0 | 7 | 11.7847 | 5 | 11.7298 |
| 1 | 5 | 9.44101 | 4 | 9.44258 |
| 2 | 4 | 9.80869 | 3 | 9.81032 |
| 3 | 3 | 9.73389 | 2 | 9.73522 |
| 4 | 3 | 9.73496 | 2 | 9.73548 |
| 5 | 3 | 9.73496 | 2 | 9.73548 |
| 6 | 3 | 9.73496 | 2 | 9.73548 |
| 7 | 3 | 9.73496 | 2 | 9.73548 |
| 8 | 3 | 9.73496 | 2 | 9.73548 |
| 9 | 3 | 9.73496 | 2 | 9.73548 |
| 10 | 3 | 9.73496 | 2 | 9.73548 |
| 11 | 3 | 9.73496 | 2 | 9.73548 |
| 12 | 3 | 9.73496 | 2 | 9.73548 |
| 13 | 3 | 9.73496 | 2 | 9.73548 |
| 14 | 3 | 9.73496 | 2 | 9.73548 |
| 15 | 3 | 9.73496 | 2 | 9.73548 |
| sum | 55 | | 38 | |

FIG. 10

OPTICAL PROXIMITY CORRECTION PROCESS

BACKGROUND OF THE INVENTION

1. Field of Invention

The present invention relates to an optical proximity correction process. More particularly, the present invention relates to an optical proximity correction process implementing an interpolation for designing a layout of a mask.

2. Description of Related Art

Nowadays, with the development of the integrated circuit (IC), element downsizing and integration is an essential trend, and is also an important topic for each industry to actively develop. In the whole semiconductor process, lithography may be referred to as one of the most important steps. Therefore, the fidelity of transferring the photomask pattern to the wafer is quite important. If the transferring of the pattern is not correct, the tolerance of the critical dimension (CD) on the chip may be affected, and the resolution of the exposure may be reduced.

The integration is gradually improved and the size of the element is gradually reduced, the distance between the elements must be reduced, therefore, in the lithography process, deviations in the transferring of the pattern may be generated, i.e. the so-called optical proximity effect (OPE). OPE may occur when the light beam is projected on the chip through the pattern on the photomask, in one aspect, the light beam is expanded due to scattering of the light beam, and in another aspect, the light beam may pass through the photoresist layer of the chip surface and may get reflected back by the semi-conductive substrate of the chip.

To remedy the aforementioned deviations, a layout is often subjected to an optical proximity correction (OPC) process, which adjusts the layout to compensate for optical effects. These adjustments are made based upon results of model-based simulations of the printed layout. During the OPC process, the layout is divided into segments, such as edges, and each segment is adjusted with a negative or a positive bias. The OPC process then re-simulates the layout and measures the deviation of the resulting output pattern from the expected position, and re-adjusts the edge biases based on this deviation.

Because the segments interact with neighboring segments, any adjustments to a given segment can affect the final printed layout for neighboring segments. Hence, in an OPC process, a number of iterations of such edge adjustments are necessary for the process to converge on an acceptable result. Consequently, convergence to a final solution can require more iterations. It is important to minimize the number of the convergence iterations because performing a large number of convergence iterations takes a great deal of run time. Hence, the cost of generating the output mask pattern is increased.

SUMMARY OF THE INVENTION

Accordingly, at least one objective of the present invention is to provide an optical proximity correction process capable of decreasing the computing times of the convergence process.

At least another objective of the present invention is to provide an optical proximity correction process capable of improving the run time of the overall iterations of the convergence process.

The present invention provides an optical proximity correction process for designing a mask with a pattern. The pattern has a plurality of edges, the mask with the pattern is designed according to a target exposure intensity of each of the edges, each of the edges is at a corresponding current edge position on the mask and each current edge position corresponds to a current exposure intensity. The optical proximity correction process comprises repeating a convergence process on each of the edges of the pattern to determine an adjusted position for each of the edges of the pattern until an adjusted exposure intensity of each of the edges at the adjusted position is substantially equal to the corresponding target exposure intensity. For each of the edges, the convergence process comprises comparing the target exposure intensity with the current exposure intensity to determine an in-position of the edge correlating to a first exposure intensity and an out-position of the edge correlating to a second exposure intensity, wherein the target exposure intensity is within a range between the first exposure intensity and the second exposure intensity. An interpolation is performed to obtain the adjusted position of the edge between the in-position and the out-position on the mask according to the target exposure intensity. The pattern is updated so that the edge is shifted from the current edge position to the adjusted position and the adjusted position is assigned to be the current edge position of the edge.

According to one embodiment of the present invention, for each of the edges, the step of comparing the target exposure intensity with the current exposure intensity comprises determining whether the current edge position is the in-position or the out-position by comparing the current exposure intensity with the target exposure intensity. When the current edge position is determined to be the in-position, the current exposure intensity is regarded as the first exposure intensity and the pattern is extended with a predetermined extending range so that the edge of the extended pattern is at the out-position and the second exposure intensity at the current edge position is computed while the edge of the extended pattern is at the out-position on the mask. When the current edge position is determined to be the out-position, the current exposure intensity is regarded as the second exposure intensity and the pattern is shrunk with a predetermined shrinking range so that the edge of the shrunk pattern is at the in-position and the first exposure intensity at the current edge position is computed while the edge of the shrunk pattern is at the in-position.

According to one embodiment of the present invention, for each of the edges, the step of determining whether the current edge position is the in-position or the out-position comprises regarding the current edge position as the in-position when the current exposure intensity is larger than the target exposure intensity and regarding the current edge position as the out-position when the current exposure intensity is smaller than the target exposure intensity.

According to one embodiment of the present invention, the designed mask with the pattern is used with a positive photoresist material.

According to one embodiment of the present invention, for each of the edges, the convergence process further comprises defining the current edge position to be an original edge position before the step of comparing the target exposure intensity with the current exposure intensity and calculating the position variation from the original edge position to the adjusted position after the step of performing the interpolation to obtain the adjusted position of the edge.

According to one embodiment of the present invention, further comprises repeating an extrapolation pre-convergence process to obtain the current edge position for each corresponding edge until the current exposure intensity corresponding to the current edge is within a target intensity tolerance before the step of repeating the convergence process on each of the edges of the pattern. Furthermore, for each edge of the pattern, the extrapolation pre-convergence process comprises shrinking the pattern with a predetermined shrinking range to obtain a first position of the edge on the mask. The pattern is extended with a predetermined extending range to obtain a second position of the edge on the mask. An extrapolation is performed to obtain the current edge position of the pattern beyond a range between the first position and the second position based on the target exposure intensity. The pattern is updated so that the edge is located at the current edge position.

According to one embodiment of the present invention further comprises repeating an interpolation pre-convergence process to obtain the current edge position for each corresponding edge until the current exposure intensity corresponding to the current edge is within a target intensity tolerance before the step of repeating the convergence process on each of the edges of the pattern. For each edge of the pattern, the interpolation pre-convergence process comprises defining the edge of the pattern to be at an original position, wherein the original position corresponds to an original exposure intensity at the original position. The original exposure intensity is compared with the target exposure intensity. When the original exposure intensity is larger than the target exposure intensity, the pattern is extended so that the edge of the extended pattern is at a first position correlating to a third exposure intensity computed at the original position. Under the circumstance mentioned above, when the third exposure intensity is larger than the target exposure intensity, the first position is regarded as an inner position, the third exposure intensity is regarded as an inner exposure intensity and the extended pattern is further extended so that the edge of the further extended pattern is at an outer position correlating to an outer exposure intensity computed at the original position. Furthermore, when the third exposure intensity is smaller than the target exposure intensity, the first position is regarded as the outer position, the third exposure intensity is regarded as the outer exposure intensity, the original position is regarded as the inner position and the original exposure intensity is regarded as the inner exposure intensity. Also, the target exposure intensity is within a range between the inner exposure intensity and the outer exposure intensity. Moreover, the current edge position of the pattern is calculated to be within between the inner position and the outer position based on the target exposure intensity. Alternatively, when the original exposure intensity is smaller than the target exposure intensity, the pattern is shrunk so that the edge of the shrunk pattern is at the inner position correlating to the inner exposure intensity computed at the original position. Moreover, the original position is regarded as the outer position and the original exposure intensity is regarded as the outer exposure intensity and the target exposure intensity is within the range between the inner exposure intensity and the outer exposure intensity. Further, the current edge position of the pattern is calculated based on the inner position, the outer position and the target exposure intensity. Then, the pattern is updated so that the edge is located at the current edge position.

The present invention provides an optical proximity correction process for designing a mask with a pattern, wherein the pattern has a plurality of edges, the mask with the pattern is designed according to a target exposure intensity of each of the edges. The optical proximity correction process comprises repeating a first convergence process based on an interpolation to obtain a current edge position for each corresponding edge until the current exposure intensity corresponding to the current edge is within a target intensity tolerance. A second convergence process is repeated on each of the edges of the pattern to determine an adjusted position for each of the edges of the pattern until an adjusted exposure intensity of each of the edges at the adjusted position is substantially equal to the corresponding target exposure intensity.

According to one embodiment of the present invention, the designed mask with the pattern is used with a positive photoresist material.

According to one embodiment of the present invention, for each edge of the pattern, the first convergence process comprises defining the edge of the pattern to be at an original position, wherein the original position corresponds to an original exposure intensity at the original position. The original exposure intensity is compared with the target exposure intensity so as to calculate the current edge position for the edge. The pattern is updated so that the edge is located at the current edge position.

According to one embodiment of the present invention, the step of comparing the original exposure intensity with the target exposure intensity comprises: when the original exposure intensity is larger than the target exposure intensity, extending the pattern so that the edge of the extended pattern is at a first position correlating to a first exposure intensity computed at the original position. Further, when the original exposure intensity is smaller than the target exposure intensity, the pattern is shrunk so that the edge of the shrunk pattern is at an inner position correlating to an inner exposure intensity computed at the original position.

According to one embodiment of the present invention, under a circumstance that the original exposure intensity is larger than the target exposure intensity, when the first exposure intensity is larger than the target exposure intensity, the first position is regarded as the inner position, the first exposure intensity is regarded as the inner exposure intensity and the extended pattern is further extended so that the edge of the further extended pattern is at an outer position correlating to an outer exposure intensity computed at the original position and when the first exposure intensity is smaller than the target exposure intensity, the first position is regarded as the outer position, the first exposure intensity is regarded as the outer exposure intensity, the original position is regarded as the inner position and the original exposure intensity is regarded as the inner exposure intensity, and the target exposure intensity is within a range between the inner exposure intensity and the outer exposure intensity, and the current edge position of the pattern is calculated to be within between the inner position and the outer position based on the target exposure intensity.

According to one embodiment of the present invention, under a circumstance that the original exposure intensity is smaller than the target exposure intensity, the original position is regarded as the outer position and the original exposure intensity is regarded as the outer exposure intensity and the target exposure intensity is within the range between the inner exposure intensity and the outer exposure intensity, and wherein the current edge position of the pattern is calculated based on the inner position, the outer position and the target exposure intensity.

According to one embodiment of the present invention, for each of the edges, the second convergence process comprises: comparing the target exposure intensity with the current exposure intensity to determine an in-position of the edge correlating to a third exposure intensity and an out-position of the edge correlating to a fourth exposure intensity, wherein the target exposure intensity is within a range between the third exposure intensity and the fourth exposure intensity. The interpolation is performed to obtain the adjusted position of the edge between the in-position and the out-position on the mask according to the target exposure intensity. The pattern is updated so that the edge is shifted from the current edge position to the adjusted position and assigning the adjusted position to be the current edge position of the edge.

According to one embodiment of the present invention, for each of the edges, the step of comparing the target exposure intensity with the current exposure intensity comprises determining whether the current edge position is the in-position or the out-position by comparing the current exposure intensity with the target exposure intensity. When the current edge position is determined to be the in-position, the current exposure intensity is regarded as the third exposure intensity and the pattern is extended with a predetermined extending range so that the edge of the extended pattern is at the out-position and the fourth exposure intensity at the current edge position is computed while the edge of the extended pattern is at the out-position on the mask. When the current edge position is determined to be the out-position, the current exposure intensity is regarded as the fourth exposure intensity and the pattern is shrunk with a predetermined shrinking range so that the edge of the shrunk pattern is at the in-position and the third exposure intensity at the current edge position is computed while the edge of the shrunk pattern is at the in-position.

According to one embodiment of the present invention, for each of the edges, the step of determining whether the current edge position is the in-position or the out-position comprises when the current exposure intensity is larger than the target exposure intensity, the current edge position is regarded as the in-position. When the current exposure intensity is smaller than the target exposure intensity, the current edge position is regarded as the out-position.

In the present invention, the main concept is to make sure that the target exposure intensity is between the current exposure intensity and the exposure intensity at the calculated point after the pattern is either extended or shrunk. Thus, the convergence process has only two major intensity calculating steps including calculating the current exposure intensity at the current edge position while the pattern is remained unchanged and calculating the exposure intensity at the current edge position after the pattern is extended or shrunk according to the comparison result between the current exposure intensity and the target exposure intensity. However, the conventional convergence process using extrapolation needs to perform at least three major intensity calculating steps including calculating the exposure intensity at the current edge position after the pattern is shrunk, calculating the exposure intensity at the current edge position after the pattern is extended and calculating the current exposure intensity while the pattern is remained unchanged. By comparing with the computing time of the conventional convergence process mentioned above, for the same edge of the pattern, the computing time of the convergence process of the present invention, which is in a form of calculating times, decreases for about 31%. Hence, the time for performing the optical proximity correction process to design the layout of the mask having the pattern thereon is greatly decreased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3C are schematic diagram showing an interpolation pre-convergence process of an optical proximity correction process for designing a mask with a pattern according to another embodiment of the invention.

FIG. 4 is a plot diagram showing an interpolation for obtaining a current edge position of an edge of the pattern according to another embodiment of the present invention.

FIGS. 5A through 5C are schematic diagram showing a pre-convergence process of an optical proximity correction process for designing a mask with a pattern according to the other embodiment of the invention.

FIG. 6 is a plot diagram showing an extrapolation for obtaining a current edge position of an edge of the pattern according to the other embodiment of the present invention.

FIG. 10 is a table showing the computing time in a form of calculating times of the optical proximity correction process of the present invention versus the computing time in a form of calculating time of the conventional optical proximity correction process.

DESCRIPTION OF EMBODIMENTS

Figure 1A:
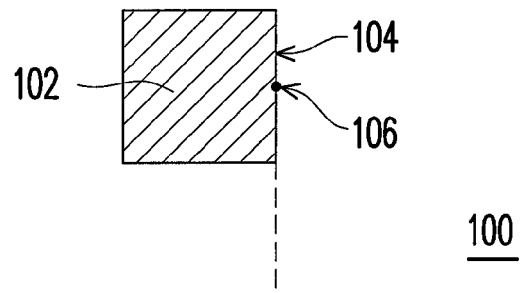
FIGS. 1A through 1C are schematic diagrams showing an optical proximity correction process for designing a mask with a pattern according to one embodiment of the invention.
Figure 1B:
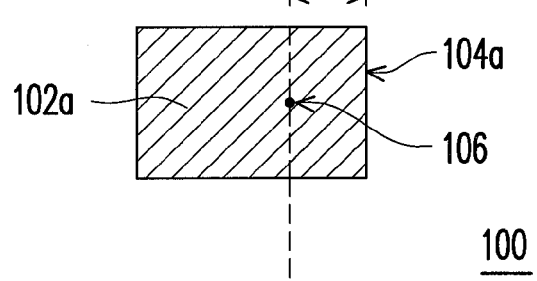
Figure 1C:
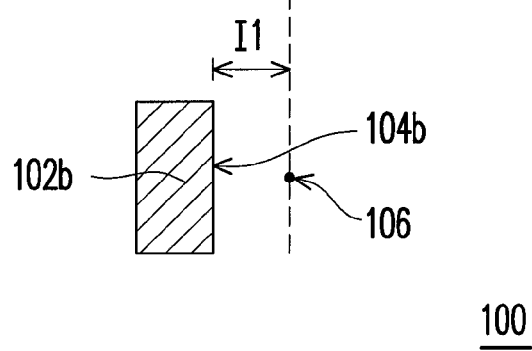

FIGS. 1A through 1C are schematic diagrams showing an optical proximity correction process for designing a mask with a pattern according to one embodiment of the invention. As shown in FIG. 1A, a pattern 102 to be formed on a mask 100 is provided. It should be noticed that, for simplifying the description, the pattern 102 with a square shape is only an exemplar and the present invention is not limited thereto. Thus, the pattern 102 to be formed on the mask 100 can be, for example, in a form of polygon. Hence, the pattern 102 has a plurality of edges, such as edge labeled with reference number 104. Moreover, the mask 100 with the pattern 102 to be formed thereon is designed according to a target exposure intensity of each of the edges. That is, for designing an ideal pattern on the mask 100, each edge (e.g. edge 104) corresponds to a target exposure intensity. Furthermore, each of the edges is at a corresponding current edge position on the mask and each current edge position corresponds to a current exposure intensity. More specifically, as for the edge 104 of pattern 102 on the mask 100, the current exposure intensity corresponding to the current edge position at a point 106 of the edge 104 at the current edge position is computed. Usually, the point 106 of the edge 104 on which the current exposure intensity is computed is the midpoint of the edge 104.

In the optical proximity correction process of the present invention, a convergence process is repeated on each of the edges of the pattern 102 to determine an adjusted position for each of the edges of the pattern 102 until an adjusted exposure intensity of each of the edges at the adjusted position is substantially equal to the corresponding target exposure intensity. That is, for one edge of the pattern in each repeating run of the convergence process, the adjusted position for the edge is calculated for the next repeating run of the convergence process performing on the same edge until the adjusted exposure intensity is substantially equal to the corresponding target exposure intensity. It should be noticed that the adjusted exposure intensity at the current edge position is computed while the edge of the pattern is shifted from the current edge position to the adjusted position due to the resizing of the pattern in the present repeating run of the convergence process. More specifically, taking the edge 104 as an example, the adjusted exposure intensity at the point 106 is computed while the edge 104 is shifted form the current edge position to the adjusted position in the present repeating run of the convergence process. Generally, in the same repeating run of the convergence process, all exposure intensity values are computed at the same point on the mask no matter the edge of the pattern is shifted or remained unchanged.

Figure 7:
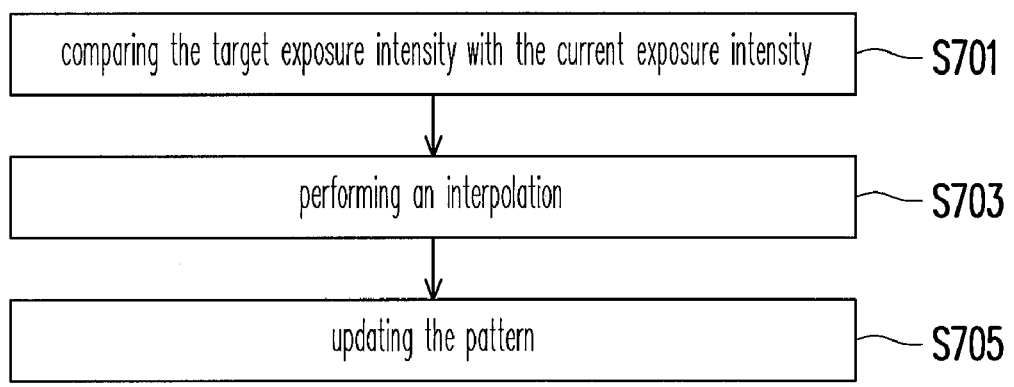
FIG. 7 is a flow chart showing a convergence process according to one embodiment of the present invention.

Hereafter, the convergence process is detailed in the following descriptions accompanying with the drawings. FIG. 7 is a flow chart showing a convergence process according to one embodiment of the present invention. As shown in FIG. 1B, FIG. 1C and FIG. 7, for each of the edges in one repeating run of the convergence process, the target exposure intensity is compared with the current exposure intensity to determine an in-position of the edge correlating to a first exposure intensity and an out-position of the edge correlating to a second exposure intensity (step S701). That is, as for the edge 104, the target exposure intensity corresponding to the edge 104 is compared with the current exposure intensity computed at the current edge position while the edge 104 is located at the current edge position. As for the edge 104, by comparing the corresponding target exposure intensity with the current exposure intensity, the in-position of the edge 104 and the out-position of the edge 104 can be obtained. Meanwhile, the first exposure intensity correlating to the in-position is computed at the current edge position, such as the point 106, while the edge 104 is shifted to be at the in-position. Also, the second exposure intensity correlating to the out-position is computed at the current edge position, such as the point 106, while the edge 104 is shifted to be at the out-position. Noticeably, the premise for determining the in-position and the out-position of the edge 104 is that the target exposure intensity should be within a range between the corresponding first exposure intensity and the corresponding second exposure intensity.

Moreover, the method for obtaining the in-position and the out-position of the edge 104 further comprises determining whether the current edge position is the in-position or the out-position by comparing the current exposure intensity with the target exposure intensity. Further, when the current edge position is determined to be the in-position, the current exposure intensity is regarded as the first exposure intensity (as shown in FIG. 1A). Then, the pattern 102 is extended with a predetermined extending range O1 so that the edge 104a of the extended pattern 102a is at the out-position on the mask 100 (as shown in FIG. 1B) and the second exposure intensity at the current edge position is computed, such as the point 106, while the edge 104a of the extended pattern 102a is at the out-position on the mask 100.

Alternatively, when the current edge position is determined to be the out-position, the current exposure intensity is regarded as the second exposure intensity (as shown in FIG. 1A). Then, the pattern 102 is shrunk with a predetermined shrinking range I1 so that the edge 104b of the shrunk pattern 102b is at the in-position and the first exposure intensity at the current edge position is computed, such as the point 106, while the edge 104b of the shrunk pattern 102b is at the in-position on the mask 100.

It should be noticed that the designed mask 100 with the pattern 102 can be, for example but not limited to, used with a positive photoresist material. Hence, for each of the edges (the edge 104 is used as an exemplar herein) under the circumstance that the designed mask 100 with the pattern 102 is used with the positive photoresist material, when the current exposure intensity is larger than the target exposure intensity, the current edge position of the edge 104 is regarded as the in-position. Alternatively, under the circumstance mentioned above, when the current exposure intensity is smaller than the target exposure intensity, the current edge position of the edge 104 is regarded as the out-position.

Figure 2:
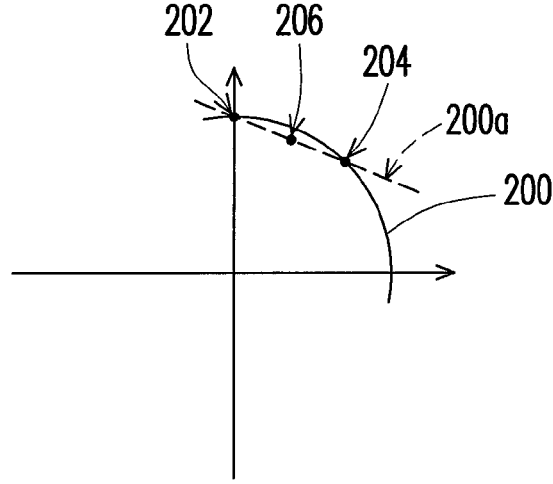
FIG. 2 is a plot diagram showing an interpolation for obtaining an adjusted position of an edge of the pattern according to one embodiment of the present invention.

Thereafter, in the step S703, an interpolation is performed to obtain the adjusted position of the edge 104 between the in-position and the out-position on the mask 100 according to the target exposure intensity. FIG. 2 is a plot diagram showing an interpolation for obtaining an adjusted position of an edge of the pattern according to one embodiment of the present invention. As shown in FIG. 2, curve 200 represents an ideal relationship between the exposure intensity and the position of the pattern on the mask. Since the in-position, the out-position, the first exposure intensity correlating to the in-position and the second exposure intensity correlating to the out-position are known, the in-position coordinate 202 (i.e. (in-position, first exposure intensity)) and out-position coordinate 204 (i.e. (out-position, second exposure intensity)) on the intensity-position plot diagram can be easily defined. Thus, the linear function of the straight dotted line 200a across both of the in-position coordinate 202 and out-position coordinate 204 on the intensity-position plot diagram can be define and the slope of the straight dotted line 200a can be calculated as well. Furthermore, the adjusted position can be calculated by inputting the known target exposure intensity corresponding to the edge 104 to the linear function of the straight dotted line 200a (as the adjusted position coordinate 206 shown in FIG. 2). Since the target exposure intensity is within a range between the corresponding first exposure intensity and the corresponding second exposure intensity, a simple interpolation as mentioned above is applied to obtain the adjusted position of the edge 104 between the in-position and the out-position on the mask 100.

In the step S705, the pattern is updated. That is, according to the adjusted position for the edge 104, the pattern is either extended or shrunk or even remained unchanged so that the edge 104 is shifted from the current edge position to the adjusted position. Meanwhile, the adjusted position is assigned to be the current edge position of the edge 104 for the next repeating run of the convergence process.

It should be noticed that, the convergence process is repeated on one edge of the pattern until the adjusted exposure intensity at the adjusted position while the edge is at the adjusted position is substantially equal to the target exposure intensity. In other words, after the pattern is updated (i.e. the step S705), when the current exposure intensity (i.e. the adjusted exposure intensity) computed at the current edge position (i.e. the adjusted position) is substantially equal to the target exposure intensity, the convergence process will not be repeated on the same edge, which means the convergence process for the edge of the pattern is done. Based on the iteration requirement, when the convergence process for one edge of the pattern is done, the convergence process is performed on another edge of the pattern. Furthermore, in another embodiment, after the convergence process is performed on all edges of the pattern, a new iteration of the convergence process starts on each edge of the pattern in sequence again. The number of the iterations of the convergence process in the optical proximity correction of the present invention can be determined by the user or the practical requirement.

For each of the edges, it should be noticed that, before the step S701, the convergence process further comprises defining the current edge position of the edge to be an original edge position. Hence, after the step S703, the position variation from the original edge position to the adjusted position can be calculated for the step S705 to update the pattern.

Figure 8:
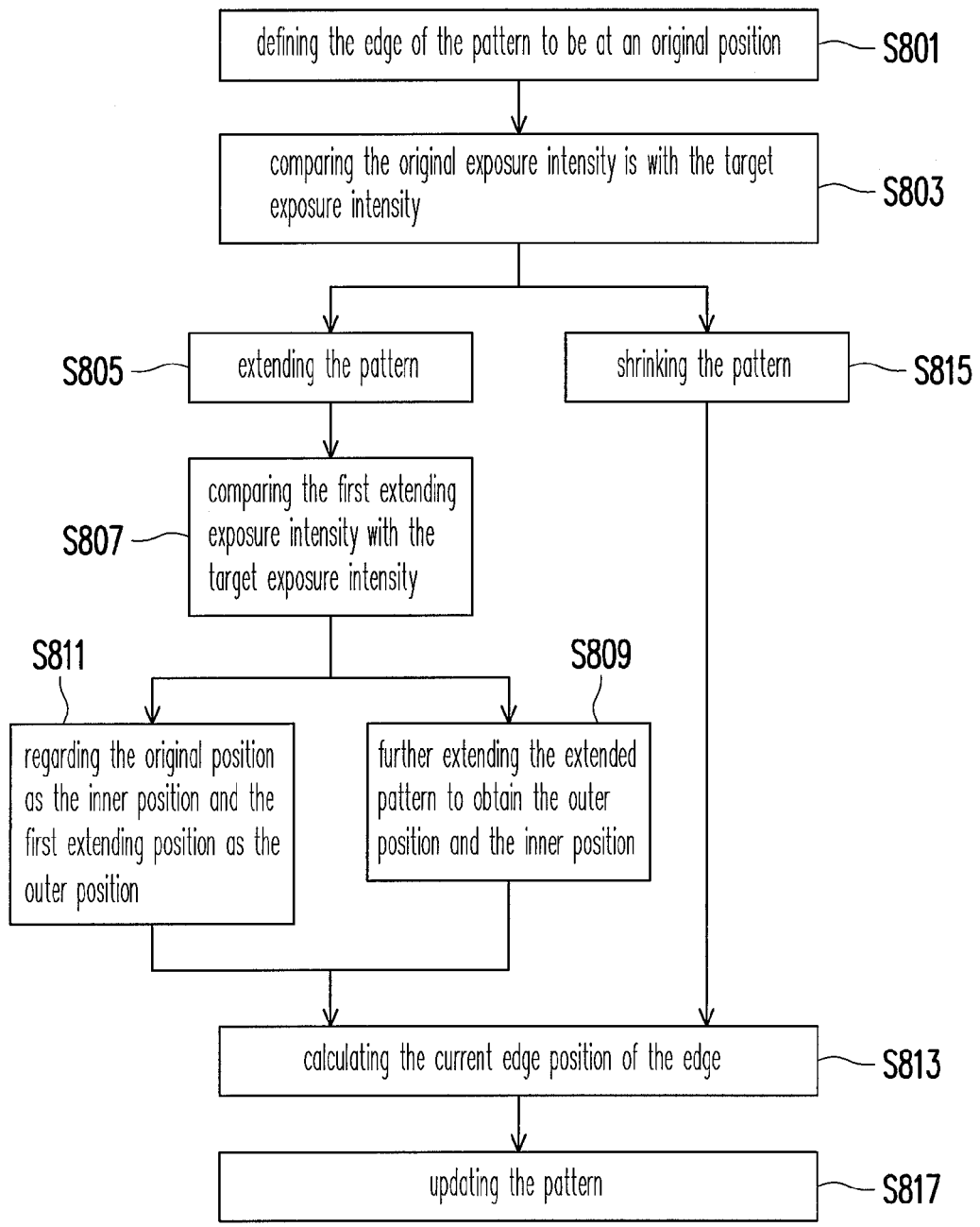
FIG. 8 is a flow chart showing an interpolation pre-convergence process according to another embodiment of the present invention.

Furthermore, for each edge of the pattern, before the convergence process is repeated, an interpolation pre-convergence process is repeated to obtain the current edge position for the corresponding edge of the pattern until the current exposure intensity computed at the current edge is within a target intensity tolerance. FIGS. 3A through 3C are schematic diagram showing an interpolation pre-convergence process of an optical proximity correction process for designing a mask with a pattern according to another embodiment of the invention. FIG. 4 is a plot diagram showing an interpolation for obtaining a current edge position of an edge of the pattern according to another embodiment of the present invention. FIG. 8 is a flow chart showing an interpolation pre-convergence process according to another embodiment of the present invention. As shown in FIG. 3A, FIG. 4 and FIG. 8, for each edge of the pattern (the edge 304 in FIGS. 3A through 3C is used as an exemplar herein), in the step S801, the edge 304 of the pattern is defined to be at an original position. Also, the original position corresponds to an original exposure intensity at the original position. More specifically, the original exposure intensity is computed at the point 306, which is the midpoint of the edge 304, on the mask 300.

Then, in the step S803, the original exposure intensity is compared with the target exposure intensity. The interpolation pre-convergence process is proceeded to the step S805, as shown in FIG. 8 and FIG. 3B, when the original exposure intensity is larger than the target exposure intensity, the pattern 302 is extended for a predetermined extending range O2 so that the edge 304a (i.e. the edge 304 in FIG. 3A) of the extended pattern 302a is at a first extending position and a first extending exposure intensity at the original position is computed, such as point 306, while the edge 304a is at the first extending position.

Under the circumstance mentioned above (step S805), the first extending exposure intensity is compared with the target exposure intensity in the step S807. In the step S809, when the first extending exposure intensity is larger than the target exposure intensity, the first extending position is regarded as an inner position and the first extending exposure intensity is regarded as an inner exposure intensity. Meanwhile, as shown in FIG. 3C, the extended pattern 302a is further extended for a predetermined extending range O3 so that the edge 304b (i.e. the edge 304a in FIG. 3B) of the further extended pattern 302b is at a second extending position and a second extending exposure intensity at the original position is computed, such as point 306, while the edge 304b of the further extended pattern 302b is at the second extending position.

Alternatively, in the step S811, when the first extending exposure intensity is smaller than the target exposure intensity, the first extending position is regarded as the outer position and the first extending exposure intensity is regarded as the outer exposure intensity. Meanwhile, the original position is regarded as the inner position and the original exposure intensity is regarded as the inner exposure intensity.

In the steps S807, S809 and S811, it is to make sure that, for the edge 304, the pattern 302 is extended enough to obtain a proper inner position correlating with the inner exposure intensity and a proper outer position correlating with the outer exposure intensity while the original exposure intensity has been larger than the target exposure intensity so that the target exposure intensity is within a range between the inner exposure intensity and the outer exposure intensity.

Moreover, in the step S813, the current edge position of the edge 304 of the pattern 302 is calculated to be within between the inner position and the outer position based on the target exposure intensity. As shown in FIG. 4, curve 400 represents the ideal relationship between the exposure intensity and the position of the pattern on the mask and the function of the curve 400 is unknown. Since the inner position, the outer position, the inner exposure intensity correlating to the inner position and the outer exposure intensity correlating to the outer position are known, the inner position coordinate 402 (i.e. (inner position, inner exposure intensity)) and outer position coordinate 404 (i.e. (outer position, outer exposure intensity)) on the intensity-position plot diagram can be easily defined. Thus, the linear function of the straight dotted line 400a across both of the inner position coordinate 402 and outer position coordinate 404 on the intensity-position plot diagram can be define and the slope of the straight dotted line 400a can be calculated as well. Furthermore, the current edge position can be calculated by inputting the known target exposure intensity corresponding to the edge 304 to the linear function of the straight dotted line 400a (as the current edge position coordinate 406 shown in FIG. 4). Since the target exposure intensity is within a range between the corresponding inner exposure intensity and the corresponding outer exposure intensity, a simple interpolation as mentioned above is applied to obtain the current edge position of the edge 304 between the inner position and the outer position on the mask 300.

Moreover, the current edge position is calculated based on the scenario that the original exposure intensity of the edge, such as the edge 304, of the pattern 302 on the mask 300 is larger than the corresponding target exposure intensity. Hereafter, the procedure for calculating the current edge position based on the scenario that the original exposure intensity of the edge 304 of the pattern 302 is smaller than the corresponding target exposure intensity is detailed in the following descriptions. As shown in FIG. 8, in the step S815, when the original exposure intensity is smaller than the target exposure intensity, the pattern 302 is shrunk so that the edge of the shrunk pattern is at the inner position and the inner exposure intensity at the original position is computed, such as point 306, while the edge is at the inner position. Meanwhile, the original position is regarded as the outer position and the original exposure intensity is regarded as the outer exposure intensity and the target exposure intensity is within the range between the inner exposure intensity and the outer exposure intensity. Further, the interpolation pre-convergence process is proceeded to the step S813, the current edge position of the pattern is calculated based on the inner position, the outer position and the target exposure intensity as mentioned above. Then, in the step S817, the pattern 302 is updated so that the edge 304 is located at the current edge position.

It should be noticed that, the interpolation pre-convergence process mentioned above is repeated on one edge of the pattern until the current exposure intensity computed at the current edge position while the edge is at the current edge position is within the target intensity tolerance. In other words, after the pattern is updated (i.e. the step S815), when the current exposure intensity computed at the current edge position is within the target intensity tolerance, the interpolation pre-convergence process will not be repeated on the same edge, which means the interpolation pre-convergence process for the edge of the pattern is done. Based on the aforementioned iteration requirement, when the interpolation pre-convergence process for one edge of the pattern is done, the interpolation pre-convergence process is performed on another edge of the pattern. Furthermore, in another embodiment, after the interpolation pre-convergence process is performed on all edges of the pattern, a new iteration of the interpolation pre-convergence process starts on each edge of the pattern in sequence again. The number of the iterations of the interpolation pre-convergence process in the optical proximity correction of the present invention can be determined by the user or the practical requirement. Generally, the number of the iterations for performing the interpolation pre-convergence process is one.

In the optical proximity correction process of the present invention, the aforementioned interpolation pre-convergence process applying the interpolation is only an exemplar of the present invention, and the present invention is not limited by the aforementioned interpolation pre-convergence process. Following descriptions introduce another pre-convergence process performed before the aforementioned convergence process is repeated to obtain the adjusted position for each edge.

Figure 9:
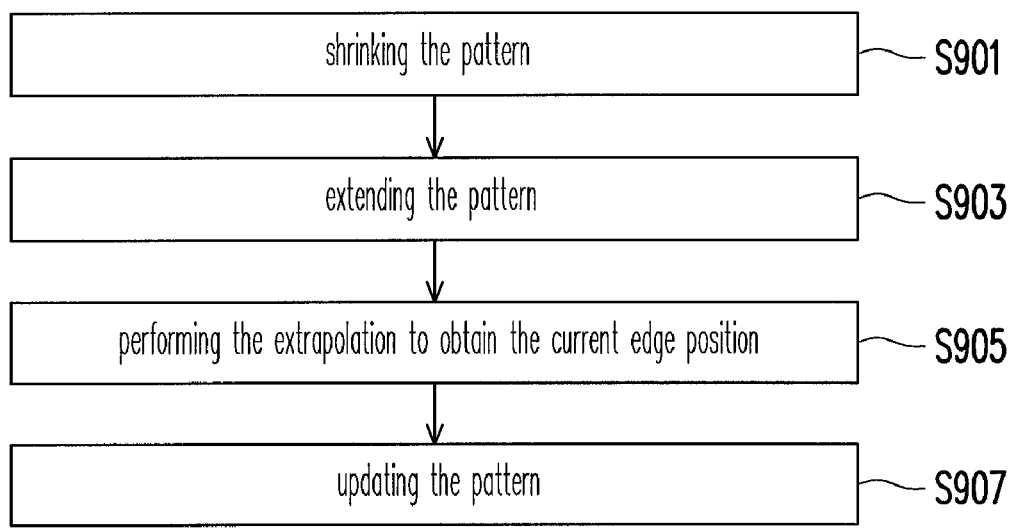
FIG. 9 is a flow chart showing a pre-convergence process according to the other embodiment of the present invention.

FIGS. 5A through 5C are schematic diagram showing a pre-convergence process of an optical proximity correction process for designing a mask with a pattern according to the other embodiment of the invention. FIG. 6 is a plot diagram showing an extrapolation for obtaining a current edge position of an edge of the pattern according to the other embodiment of the present invention. FIG. 9 is a flow chart showing a pre-convergence process according to the other embodiment of the present invention. For each edge (the edge 504 drawn in dotted line is an exemplar hereafter) of the pattern, an extrapolation pre-convergence process is performed. In the step S901, as shown in FIG. 5A and FIG. 9, the pattern (the pattern 512 shown in FIG. 5C) is shrunk with a predetermined shrinking range I2 to obtain a first position of the edge 504a of the shrunk pattern 502a on the mask 500. Meanwhile, a first exposure intensity at the point 506 is computed while the edge 504a of the shrunk pattern 502a is at the first position. Then, in the step S903, as shown in FIG. 5B, the pattern (the pattern 512 shown in FIG. 5C) is extended with a predetermined extending range O4 to obtain a second position of the edge 504b of the extended pattern 502b on the mask 500. Meanwhile, a second exposure intensity at the point 506 is computed while the edge 504b of the extended pattern 502b is at the second position. The major difference between the interpolation pre-convergence process and the extrapolation pre-convergence process is that it is not necessary to compare the target exposure intensity with the original exposure intensity computed at the point 506, which is midpoint of edge 504, while the pattern 512 is remained unchanged (as shown in FIG. 5C). Since the line width and the pitch of the semiconductor device are decreased, even the pattern is shrunk to obtain the first position and is extended to obtain the second position, the position corresponding to the target exposure intensity on the mask is easily beyond the range between the first position and the second position on the mask 500. Hence, the extrapolation is applied herein to obtain the current edge position corresponding to a current exposure intensity within the target exposure intensity tolerance.

Therefore, in the step S905, the extrapolation is performed to obtain the current edge position of the pattern beyond a range between the first position and the second position based on the target exposure intensity. As shown in FIG. 6, curve 600 represents the ideal relationship between the exposure intensity and the position of the pattern on the mask and the function of the curve 600 is unknown. Since the first position, the second position, the first exposure intensity correlating to the first position and the second exposure intensity correlating to the second position are known, the first position coordinate 602 (i.e. (first position, first exposure intensity)) and second position coordinate 604 (i.e. (second position, outer second intensity)) on the intensity-position plot diagram can be easily defined. Thus, the linear function of the straight dotted line 600a across both of the first position coordinate 602 and second position coordinate 604 on the intensity-position plot diagram can be define and the slope of the straight dotted line 600a can be calculated as well. Furthermore, by applying the extrapolation with the given target exposure intensity, the current edge position can be calculated (as the current edge position coordinate 606 shown in FIG. 6).

Thereafter, in the step S907, the pattern is updated so that the edge is located at the current edge position. Similar to the interpolation pre-convergence process, after the pattern is updated (i.e. the step S907), when the current exposure intensity computed at the current edge position is within the target intensity tolerance, the extrapolation pre-convergence process will not be repeated on the same edge, which means the extrapolation pre-convergence process for the edge of the pattern is done. Based on the aforementioned iteration requirement, when the extrapolation pre-convergence process for one edge of the pattern is done, the extrapolation pre-convergence process is performed on another edge of the pattern. Furthermore, in another embodiment, after the extrapolation pre-convergence process is performed on all edges of the pattern, a new iteration of the extrapolation pre-convergence process starts on each edge of the pattern in sequence again. The number of the iterations of the extrapolation pre-convergence process in the optical proximity correction of the present invention can be determined by the user or the practical requirement. Generally, the number of the iterations for performing the extrapolation pre-convergence process is one.

In the present invention, the convergence process has only two major intensity calculating steps. One is calculating the current exposure intensity at the current edge position while the pattern is remained unchanged. The other is calculating the exposure intensity at the current edge position after the pattern is extended or shrunk according to the comparison result between the current exposure intensity and the target exposure intensity. However, the conventional convergence process using extrapolation needs to perform at least three major intensity calculating steps including calculating the exposure intensity at the current edge position after the pattern is shrunk, calculating the exposure intensity at the current edge position after the pattern is extended and calculating the current exposure intensity while the pattern is remained unchanged. FIG. 10 is a table showing the computing time in a form of calculating times of the optical proximity correction process of the present invention versus the computing time in a form of calculating time of the conventional optical proximity correction process. As shown in FIG. 10, the iteration number 0 denotes the pre-convergence process performed on single edge of the pattern. Further, the iteration numbers 1 through 15 respectively denote the convergence process performed on the single edge of the pattern. Taking the iteration number 4 as an example, the calculating times (i.e. the convergence repeating time) for performing the convergence process of the present invention on the single edge of the pattern is twice and the calculating times for performing the conventional convergence process on the same edge of the pattern is thrice. More specifically, by comparing with the computing time of the conventional convergence process mentioned above, for the same edge of the pattern, the computing time of the convergence process of the present invention in a form of calculating times decreases for about 31%. Furthermore, while the optical proximity correction process of the present invention further includes the pre-convergence process performed before the convergence process, the overall calculating times improves from 55 to 38 as shown in FIG. 10. In other words, the optical proximity correction process of the present invention improves the total run time for about 31%. Hence, the time for performing the optical proximity correction process to design the layout of the mask having the pattern thereon is greatly decreased.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An optical proximity correction process for designing a mask with a pattern, wherein the pattern has a plurality of edges, the mask with the pattern is designed according to a target exposure intensity of each of the edges, each of the edges is at a corresponding current edge position on the mask and each current edge position corresponds to a current exposure intensity, the optical proximity correction process comprising:

repeating a convergence process on each of the edges of the pattern to determine an adjusted position for each of the edges of the pattern until an adjusted exposure intensity of each of the edges at the adjusted position is substantially equal to the corresponding target exposure intensity, wherein, for each of the edges, the convergence process comprises:

comparing the target exposure intensity with the current exposure intensity to determine an in-position of the edge correlating to a first exposure intensity and an out-position of the edge correlating to a second exposure intensity, wherein the target exposure intensity is within a range between the first exposure intensity and the second exposure intensity;

performing an interpolation to obtain the adjusted position of the edge between the in-position and the out-position on the mask according to the target exposure intensity; and updating the pattern so that the edge is shifted from the current edge position to the adjusted position and assigning the adjusted position to be the current edge position of the edge.

2. The optical proximity correction process of claim 1, wherein, for each of the edges, the step of comparing the target exposure intensity with the current exposure intensity comprises:

determining whether the current edge position is the in-position or the out-position by comparing the current exposure intensity with the target exposure intensity;

when the current edge position is determined to be the in-position, regarding the current exposure intensity as the first exposure intensity and extending the pattern with a predetermined extending range so that the edge of the extended pattern is at the out-position and the second exposure intensity at the current edge position is computed while the edge of the extended pattern is at the out-position on the mask;

when the current edge position is determined to be the out-position, regarding the current exposure intensity as the second exposure intensity and shrinking the pattern with a predetermined shrinking range so that the edge of the shrunk pattern is at the in-position and the first exposure intensity at the current edge position is computed while the edge of the shrunk pattern is at the in-position.

3. The optical proximity correction process of claim 2, wherein, for each of the edges, the step of determining whether the current edge position is the in-position or the out-position comprises:

when the current exposure intensity is larger than the target exposure intensity, regarding the current edge position as the in-position; and when the current exposure intensity is smaller than the target exposure intensity, regarding the current edge position as the out-position.

4. The optical proximity correction process of claim 3, wherein the designed mask with the pattern is used with a positive photoresist material.

5. The optical proximity correction process of claim 1, wherein, for each of the edges, the convergence process further comprises:

defining the current edge position to be an original edge position before the step of comparing the target exposure intensity with the current exposure intensity; and calculating the position variation from the original edge position to the adjusted position after the step of performing the interpolation to obtain the adjusted position of the edge.

6. The optical proximity correction process of claim 1, further comprising:

repeating an extrapolation pre-convergence process to obtain the current edge position for each corresponding edge until the current exposure intensity corresponding to the current edge is within a target intensity tolerance before the step of repeating the convergence process on each of the edges of the pattern, wherein, for each edge of the pattern, the extrapolation pre-convergence process comprises:

shrinking the pattern with a predetermined shrinking range to obtain a first position of the edge on the mask;

extending the pattern with a predetermined extending range to obtain a second position of the edge on the mask;

performing an extrapolation to obtain the current edge position of the pattern beyond a range between the first position and the second position based on the target exposure intensity; and updating the pattern so that the edge is located at the current edge position.

7. The optical proximity correction process of claim 1, further comprising:

repeating an interpolation pre-convergence process to obtain the current edge position for each corresponding edge until the current exposure intensity corresponding to the current edge is within a target intensity tolerance before the step of repeating the convergence process on each of the edges of the pattern, wherein, for each edge of the pattern, the interpolation pre-convergence process comprises:

defining the edge of the pattern to be at an original position, wherein the original position corresponds to an original exposure intensity at the original position;

comparing the original exposure intensity with the target exposure intensity;

when the original exposure intensity is larger than the target exposure intensity, extending the pattern so that the edge of the extended pattern is at a first position correlating to a third exposure intensity computed at the original position, wherein when the third exposure intensity is larger than the target exposure intensity, the first position is regarded as an inner position, the third exposure intensity is regarded as an inner exposure intensity and the extended pattern is further extended so that the edge of the further extended pattern is at an outer position correlating to an outer exposure intensity computed at the original position and wherein when the third exposure intensity is smaller than the target exposure intensity, the first position is regarded as the outer position, the third exposure intensity is regarded as the outer exposure intensity, the original position is regarded as the inner position and the original exposure intensity is regarded as the inner exposure intensity and wherein the target exposure intensity is within a range between the inner exposure intensity and the outer exposure intensity, and wherein the current edge position of the pattern is calculated to be within between the inner position and the outer position based on the target exposure intensity;

when the original exposure intensity is smaller than the target exposure intensity, shrinking the pattern so that the edge of the shrunk pattern is at the inner position correlating to the inner exposure intensity computed at the original position, wherein the original position is regarded as the outer position and the original exposure intensity is regarded as the outer exposure intensity and the target exposure intensity is within the range between the inner exposure intensity and the outer exposure intensity, and wherein the current edge position of the pattern is calculated based on the inner position, the outer position and the target exposure intensity; and updating the pattern so that the edge is located at the current edge position.

8. An optical proximity correction process for designing a mask with a pattern, wherein the pattern has a plurality of edges, the mask with the pattern is designed according to a target exposure intensity of each of the edges, the optical proximity correction process comprising:

repeating a first convergence process based on an interpolation to obtain a current edge position for each corresponding edge until a current exposure intensity corresponding to the current edge is within a target intensity tolerance;

repeating a second convergence process on each of the edges of the pattern to determine an adjusted position for each of the edges of the pattern until an adjusted exposure intensity of each of the edges at the adjusted position is substantially equal to the corresponding target exposure intensity.

9. The optical proximity correction process of claim 8, wherein the designed mask with the pattern is used with a positive photoresist material.

10. The optical proximity correction process of claim 8, wherein, for each edge of the pattern, the first convergence process comprises:

defining the edge of the pattern to be at an original position, wherein the original position corresponds to an original exposure intensity at the original position;

comparing the original exposure intensity with the target exposure intensity so as to calculate the current edge position for the edge; and updating the pattern so that the edge is located at the current edge position.

11. The optical proximity correction process of claim 10, wherein the step of comparing the original exposure intensity with the target exposure intensity comprises:

when the original exposure intensity is larger than the target exposure intensity, extending the pattern so that the edge of the extended pattern is at a first position correlating to a first exposure intensity computed at the original position; and when the original exposure intensity is smaller than the target exposure intensity, shrinking the pattern so that the edge of the shrunk pattern is at an inner position correlating to an inner exposure intensity computed at the original position.

12. The optical proximity correction process of claim 11, wherein, under a circumstance that the original exposure intensity is larger than the target exposure intensity, when the first exposure intensity is larger than the target exposure intensity, the first position is regarded as the inner position, the first exposure intensity is regarded as the inner exposure intensity and the extended pattern is further extended so that the edge of the further extended pattern is at an outer position correlating to an outer exposure intensity computed at the original position and when the first exposure intensity is smaller than the target exposure intensity, the first position is regarded as the outer position, the first exposure intensity is regarded as the outer exposure intensity, the original position is regarded as the inner position and the original exposure intensity is regarded as the inner exposure intensity, and wherein the target exposure intensity is within a range between the inner exposure intensity and the outer exposure intensity, and wherein the current edge position of the pattern is calculated to be within between the inner position and the outer position based on the target exposure intensity.

13. The optical proximity correction process of claim 12, wherein, under a circumstance that the original exposure intensity is smaller than the target exposure intensity, the original position is regarded as the outer position and the original exposure intensity is regarded as the outer exposure intensity and the target exposure intensity is within the range between the inner exposure intensity and the outer exposure intensity, and wherein the current edge position of the pattern is calculated based on the inner position, the outer position and the target exposure intensity.

14. The optical proximity correction process of claim 8, wherein, for each of the edges, the second convergence process comprises:

comparing the target exposure intensity with the current exposure intensity to determine an in-position of the edge correlating to a third exposure intensity and an out-position of the edge correlating to a fourth exposure intensity, wherein the target exposure intensity is within a range between the third exposure intensity and the fourth exposure intensity;

performing the interpolation to obtain the adjusted position of the edge between the in-position and the out-position on the mask according to the target exposure intensity; and updating the pattern so that the edge is shifted from the current edge position to the adjusted position and assigning the adjusted position to be the current edge position of the edge.

15. The optical proximity correction process of claim 14, wherein, for each of the edges, the step of comparing the target exposure intensity with the current exposure intensity comprises:

determining whether the current edge position is the in-position or the out-position by comparing the current exposure intensity with the target exposure intensity;

when the current edge position is determined to be the in-position, regarding the current exposure intensity as the third exposure intensity and extending the pattern with a predetermined extending range so that the edge of the extended pattern is at the out-position and the fourth exposure intensity at the current edge position is computed while the edge of the extended pattern is at the out-position on the mask;

when the current edge position is determined to be the out-position, regarding the current exposure intensity as the fourth exposure intensity and shrinking the pattern with a predetermined shrinking range so that the edge of the shrunk pattern is at the in-position and the third exposure intensity at the current edge position is computed while the edge of the shrunk pattern is at the in-position.

16. The optical proximity correction process of claim 15, wherein, for each of the edges, the step of determining whether the current edge position is the in-position or the out-position comprises:

when the current exposure intensity is larger than the target exposure intensity, regarding the current edge position as the in-position; and when the current exposure intensity is smaller than the target exposure intensity, regarding the current edge position as the out-position.

\* \* \* \* \*